(12) United States Patent
Svendsen et al.

(10) Patent No.: US 7,260,233 B2
(45) Date of Patent: Aug. 21, 2007

(54) HEARING AID OR SIMILAR AUDIO DEVICE AND METHOD FOR PRODUCING A HEARING AID

(75) Inventors: Klaus L. Svendsen, Hellerup (DK); Per Lundberg, Hellerup (DK)

(73) Assignee: Oticon A/S, Smørum (DK)

( * ) Notice: Subject to any disclaimer, the term of this patent is extended or adjusted under 35 U.S.C. 154(b) by 0 days.

(21) Appl. No.: 10/520,260

(22) PCT Filed: Jun. 13, 2003

(86) PCT No.: PCT/DK03/00395

§ 371 (c)(1),
(2), (4) Date: Feb. 24, 2005

(87) PCT Pub. No.: WO2004/008802

PCT Pub. Date: Jan. 22, 2004

(65) Prior Publication Data

US 2005/0117763 A1    Jun. 2, 2005

(30) Foreign Application Priority Data

Jul. 10, 2002   (DK) .............................. 2002 01087

(51) Int. Cl.
*H04R 25/00* (2006.01)
(52) U.S. Cl. ................ 381/322; 381/324; 429/98
(58) Field of Classification Search ............ 381/312, 381/322, 324, 328, 330, 380, 381, 384; 257/773, 257/774; 29/846, 852
See application file for complete search history.

(56) References Cited

U.S. PATENT DOCUMENTS

| 3,045,073 | A |   | 7/1962  | Vickerson    |         |
|-----------|---|---|---------|--------------|---------|
| 3,239,093 | A | * | 3/1966  | Gath         | 381/322 |
| 3,598,928 | A | * | 8/1971  | Hickox       | 381/324 |
| 4,639,556 | A | * | 1/1987  | Hartl et al. | 381/324 |
| 4,783,815 | A |   | 11/1988 | Buttner      |         |
| 5,185,802 | A |   | 2/1993  | Stanton      |         |
| 5,914,534 | A |   | 6/1999  | Todd et al.  |         |
| 6,245,092 | B1|   | 6/2001  | Schaldach    |         |
| 6,430,296 | B1|   | 8/2002  | Olsen        |         |
| 2003/0199204 | A1 | * | 10/2003 | Sauer et al. | 439/736 |

FOREIGN PATENT DOCUMENTS

| CH | 677054   | 3/1991 |
| DE | 19529380 | 3/1997 |
| DE | 19648080 | 5/1998 |

(Continued)

OTHER PUBLICATIONS

Feldmann, K. et al., Automated assembly of new 3D molded interconnect devices, Sep. 1991, Electronics Manufacturing TechnologySymposium, 1991., Eleventh IEEE/CHMT International, pp. 320-324.*

*Primary Examiner*—Daniel Swerdlow
(74) *Attorney, Agent, or Firm*—Dykema Gossett PLLC

(57) ABSTRACT

Hearing aid or similar device, where the device comprises at least one structural part whereto two or more spaced apart electronic components are fastened and where electric leads interconnects the electronic components and where the electric leads are provided on the surface of the structural part of the hearing aid.

2 Claims, 5 Drawing Sheets

| | FOREIGN PATENT DOCUMENTS | | WO | 0154457 | 7/2002 |
|----|----------|--------|----|------------------|--------|
| | | | WO | WO 2003049495 A1 * | 6/2003 |
| DE | 10048337 | 3/2002 | | | |
| EP | 0481528 | 4/1992 | | | |
| GB | 2234885 | 2/1991 | * cited by examiner | | |

HEARING AID OR SIMILAR AUDIO DEVICE AND METHOD FOR PRODUCING A HEARING AID

AREA OF THE INVENTION

The invention concerns a hearing aid or other audio device for delivering a sound signal to the ear of a user. The hearing aid or audio device has a structural part and at least two spaced apart electronic components. The structural parts carry the spaced apart electronic components. The audio device could be a head-set with wireless or wired connection to a telephone or other device for producing sound. Also a microphone for capturing sound and provided with wired or wireless transmission means may in this connection be covered by the term hearing aid.

BACKGROUND OF THE INVENTION

In one type of prior art hearing aids the electronic components are fastened to a circuit board whereon the electric leads, which interconnect the electronic components are printed and the circuit board is then fastened to the structural parts of the hearing aid. The circuit board can be either rigid or flexible. The use of a circuit board makes placement and fixation of the electronic component easy and straightforward, and it can be done in automated processes. The problem is that the circuit board takes up space in the hearing aid or headset, and as small size audio devices are in high demand by the users this is a sever problem.

In another type of prior art hearing aids the circuit board is at least partially substituted with thin wires. The use of such wires is highly undesirable, because trained personnel must carry out fastening of the wires to the components by hand. This makes the resulting hearing aid expensive to manufacture and the hand operation is prone to a high rate of errors.

It is known in electronic devices to provide electric leads directly on non-flat polymer surfaces. This is done by firstly marking traces and areas for the leads by laser light in order to change the structure of the polymer surface. Thereby it becomes possible to adhere layers of metal to the marked traces and areas and in this way electric leads may be formed directly on the polymer surface. The process is known under the name of 3D-MID: Moulded Interconnect Devices. Electronic components may then be placed on the surface and through a usual re-flow soldering process gain electric connection with the leads and physical good connection with the surface. It has previously not been seen as an advantage to use this technique in connection with the production of hearing aids.

SUMMARY OF THE INVENTION

The object of the invention is to provide a hearing aid or other similar electronic device without any of the above problems.

The invention concerns a hearing aid or other audio device, where the device comprises at least one structural part whereto two or more spaced apart electronic components are fastened and where electric leads interconnects the electronic components and where the electric leads are provided on the surface of the structural part of the hearing aid.

Through this construction it becomes possible to wholly omit the circuit board in hearing aids and the required number of electric wires can be kept very low. Thereby the hearing aids can be made considerably smaller than prior art hearing aids. Further the possibility of placing the electronic components on non-flat surfaces and independently of the presence of a printed circuit board makes it possible to make more compact audio devices. During the manufacture highly automated processes can be utilized and this facilitates both cheaper and less failure prone production. Also in prior art hearing aids it has been a problem that wires, if used must be precisely placed in order to avoid electronic coupling between various electronic components within the apparatus. This problem is also solved in hearing aids or headsets according to the invention.

In one embodiment the hearing aid is a behind the ear style hearing aid, wherein the leads are provided on the inside of the casing, which encloses the electronic components of the hearing aid. Such a hearing aid can be made completely without a circuit board. Thereby the number of parts will become superfluous or decrease in size, and this makes the device cheaper to manufacture and more appealing to the user.

In a further embodiment, the hearing aid is an in the ear style hearing aid and the structural parts comprises a shell, which is custom made to fit inside the ear and ear canal of the user, and a faceplate, which forms the parts facing away from the user whereby the leads are placed on the inside surface of the faceplate. In this way a smaller hearing aid can be produced.

DESCRIPTION OF A PREFERRED EMBODIMENT

Figure 1:
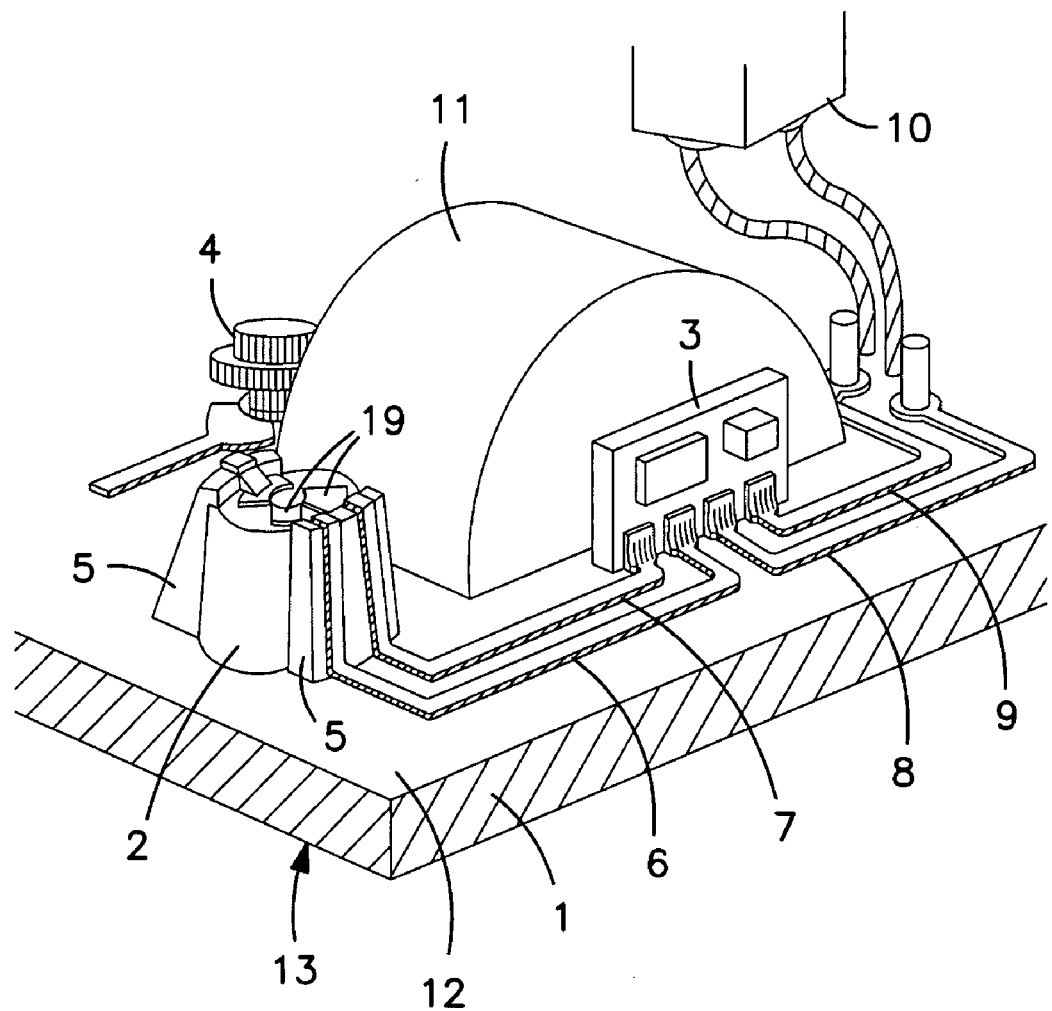
FIG. 1 is a perspective view of an inside part of a hearing aid or headset.

Different examples of the invention are described in detail with reference to the drawing.

In FIG. 1 hearing aid electric components 2,3,4 are mounted directly onto a structural part 1. The structural part is a polymer or plastic part and it could form part of the hearing aid casing or the faceplate and in either case, a first side 12 of the structural part 1 is an internal face and the other side 13 forms an outside face of the hearing aid. A microphone 2 is mounted in a snap mount 5 and electric leads 6,7 to/from the microphone are formed directly on the first side 12 of the structural part 1. The leads 6,7 follow the surface of the part 1 and run along the near vertical surface of the snap mount 5 and gain contact with the solder connections points 19 at the back end of the microphone 2. The leads 6,7 provide electric connection between the amplifier 3 and the microphone.

The amplifier 3 is mounted directly onto the structural part 1 and further leads 8,9 are provided for connection between the amplifier 3 and other components 4, 10 of the hearing aid. The amplifier may consist of a silicon hip with electric components mounded directly thereon or the amplifier may comprise some sort of circuit board for mount of the IC and the further components.

At 4 a switch device is shown, which will be further explained in the following. A receiver or speaker 10 is also partially shown. Also a battery housing 11 is displayed. The battery housing 11 is accessible from the other side 13 of the structural part 1.

Figure 2:
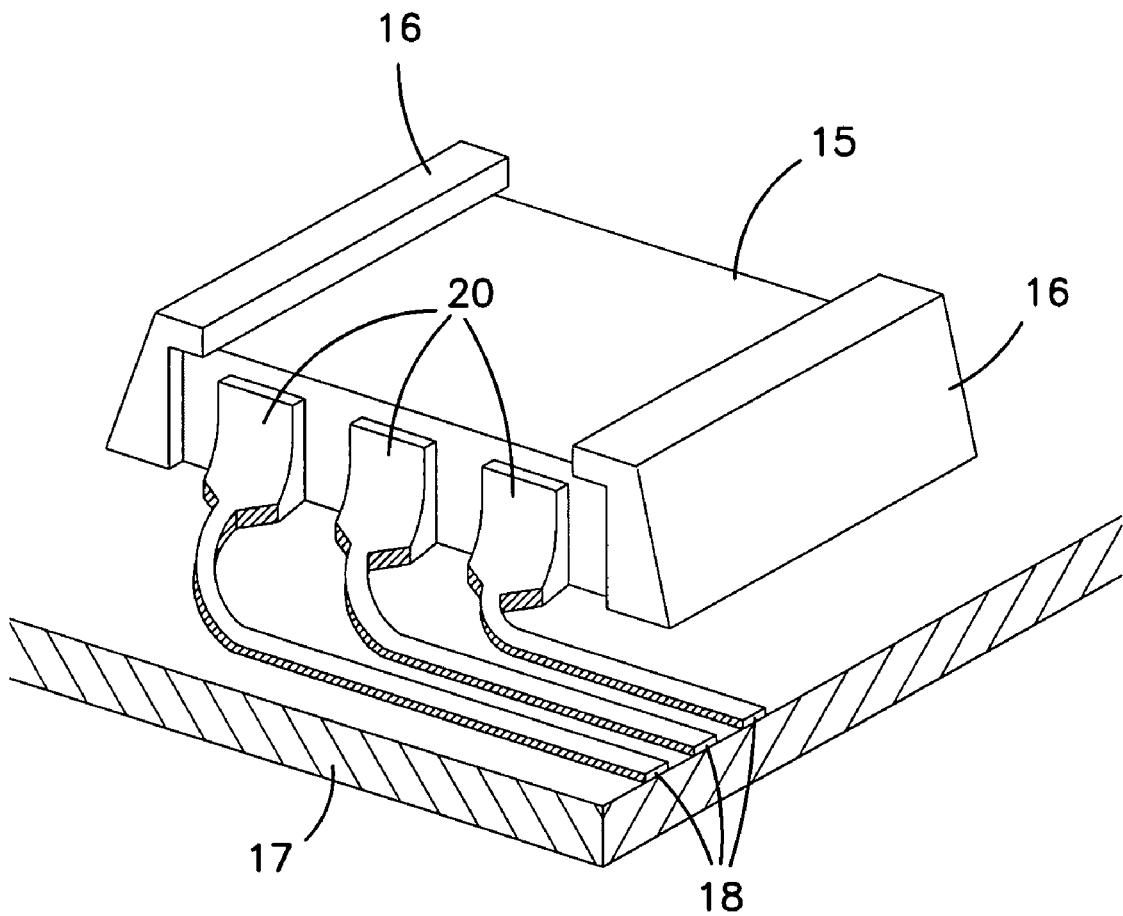
FIG. 2 is a perspective view of processor mounted directly onto the internal surface of a cabinet part of an audio device FIG. 3 displays a perspective view of push button, where the electric leads are formed directly on the surface of the cabinet part having the push button.

A flat microphone 15 is shown in FIG. 2. The microphone 15 is mounted in slots 16 formed in a structural part 17. Electric leads 18 are provided on the structural part 17 for power supply and signal output from the microphone 15. The connection to the microphone 15 from the leads 18 is made by usual solder bumps 20.

Figure 3:
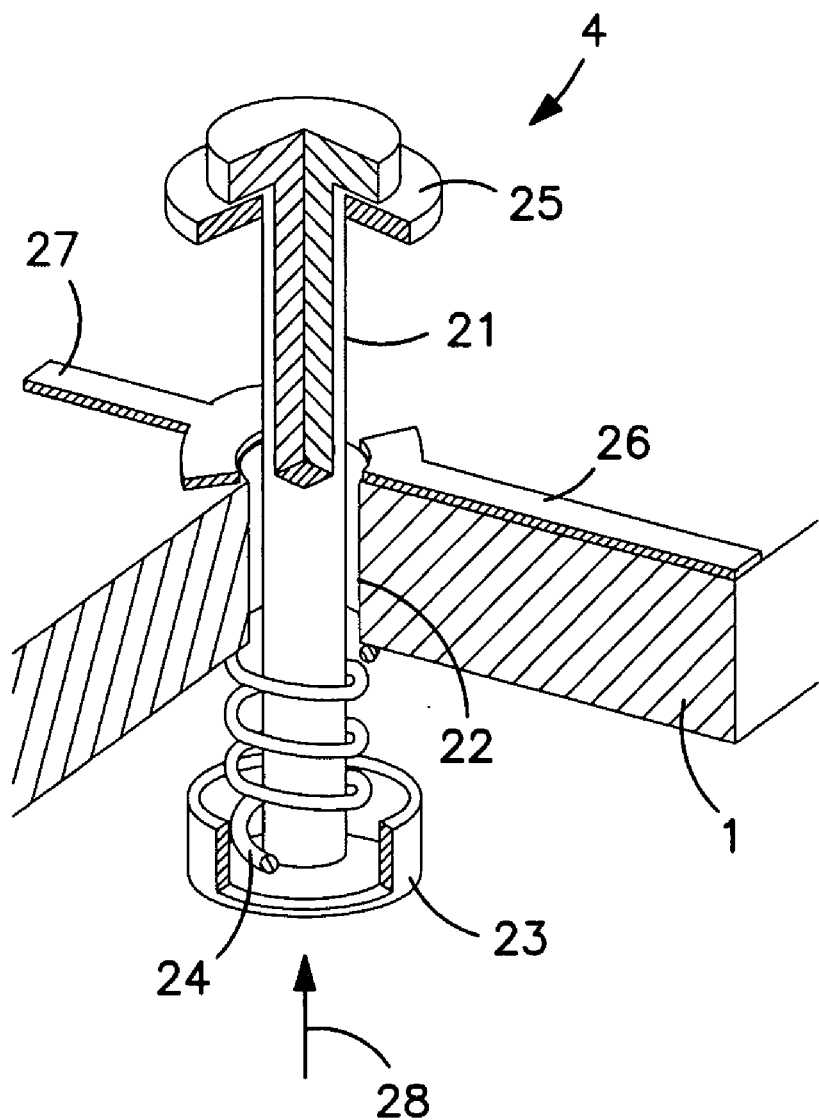

FIG. 3 displays the switch device 4 in an enlarged view, and with part of the structural part 1 being removed for better view of the functional parts of the switch device 4. The switch device 4 comprises a pin 21 mounted in a hole 22 through the structural part 1. A push button 23 and a spring 24 are mounted at the pin 21 on the outside surface of the structural part 1. At the inside the pin 21 has a disk 25 of conductive material fixed at the outer end thereof. A fist lead 26 and a second lead 27 are provided next to the hole 22, but the two leads are isolated from each other. By axial movement of the pin 21 in the hole 22 the disc 25 of conductive material is caused to contact the two leads 26, 27 and an electric connection is established between the two leads. When uninfluenced the spring 24 will cause the pin to move and contact between the two leads 26 and 27 is established. When the push button 23 is moved in the direction of the arrow 28, the disc 25 is lifted, and the contact between the leads 26 and 27 is broken.

Figure 4:
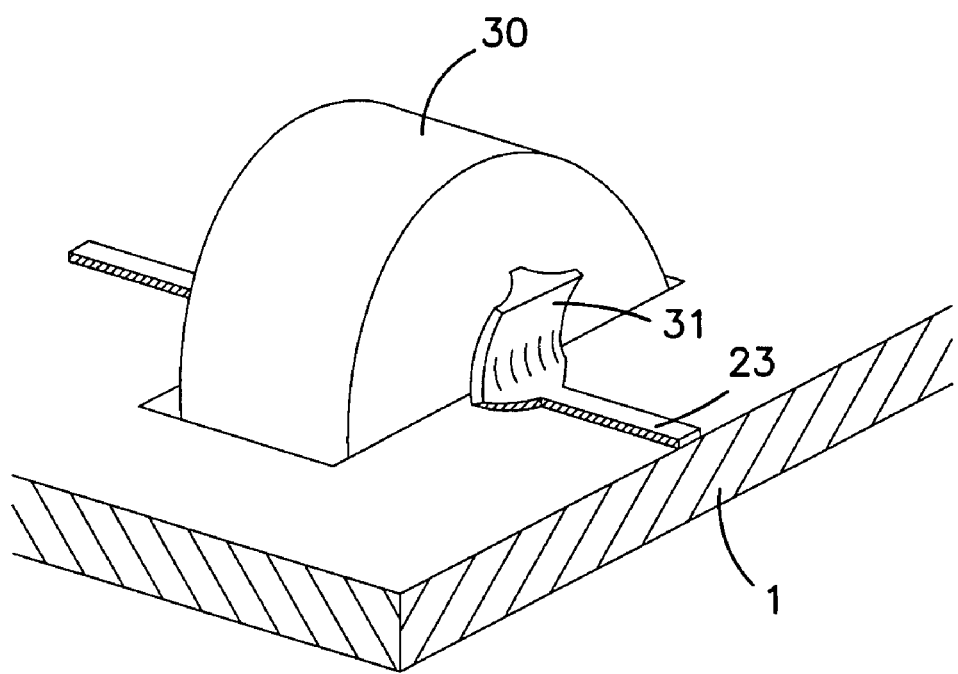
FIG. 4 shows electric leads to/from a battery and FIG. 5 shows connections to a receiver in a hearing aid or similar device.

FIG. 4 shows a battery 30 and battery connection 31. A battery connection 31 at one side of the battery is partially embedded in the material of the structural part 1. A lead 33, which connects to the connection part 31 is located on the surface of the material of the structural part 1. A similar connection is provided at the opposite side of the battery. The connection part 31 is made of flexible material and hereby a spring action is provided, which ensures good connection to the battery 30. The connection part itself can be made of a separate metal unit, which is molded into the material of the structural part 1. It can also be formed as an integral part of the structural part 1, whereby the MID lead 23 continues along the surface of the spring part 31 and connects the battery directly or connects a metal sprig or needle, which then contacts the battery surface.

Figure 5:
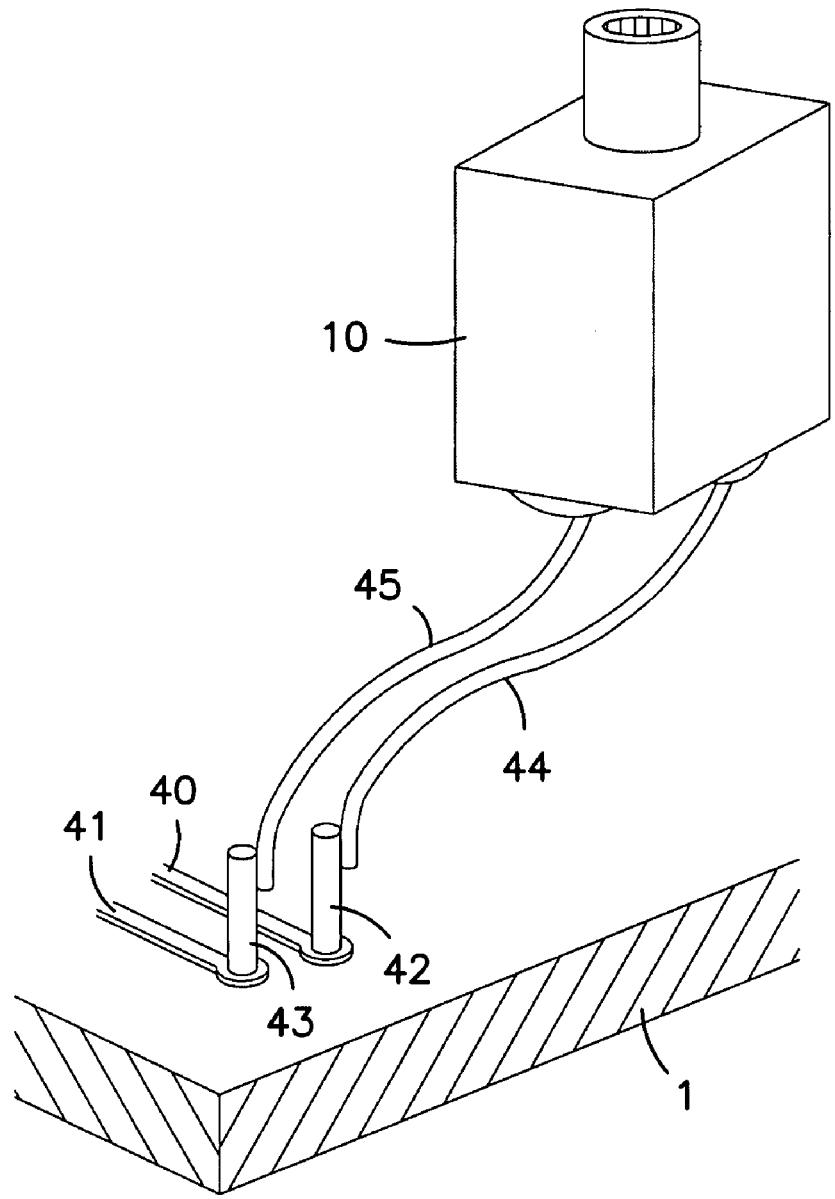

In FIG. 5 a receiver 10 is shown above the structural part 1. The receiver 10 is suspended in the usual way, and this is not shown. Leads 40, 41 are formed on the structural part 1 and terminate at pins 42,43, which are partially embedded in the material of the structural part 1. Wires 44,45 are provided from the pins 42,43 to the receiver 10. In this way it is ensured that the receiver is acoustically and vibrationally isolated from other structural parts of the hearing aid.

In the above examples the structural part 1 is a part of the external casing of the hearing aid, but the leads and the devices my also be provided on an internal wall, which divide the internal space of the hearing aid into two sections. It is also possible to have a lead penetrate a wall from one side of the wall to the other. Also it is possible using well-known techniques from the production of printed circuit boards to provide leads, which cross one another. In certain cases it may be an advantage to provide a printed circuit board for some of the components, where other components are connected by leads on the structural parts of the hearing aid as described above.

The invention claimed is:

1. A hearing aid which comprises a moulded structural part having a microphone, an amplifier, battery connections formed therein, and electric leads which extend along a surface of the structural part and interconnect the microphone, the amplifier and the battery connections, said electric leads as they extend along the surface of the moulded structural part being formed on and continuously connected to the moulded structural part, wherein the battery connections are an integral part of the moulded structural part and are shaped to provide a spring action, and whereby an electric lead continues along the surface of the moulded structural part and the battery connection and directly connects to a battery.

2. A hearing aid which comprises a moulded structural part having a microphone, an amplifier, battery connections formed therein, and electric leads which extend along a surface of the structural part and interconnect the microphone, the amplifier and the battery connections, said electric leads as they extend along the surface of the moulded structural part being formed on and continuously connected to the moulded structural part, wherein the battery connections are an integral part of the moulded structural part and are shaped to provide a spring action, and whereby an electric lead continues along the surface of the moulded structural part and the battery connection and connects to a sprig or needle that contacts a battery surface.

* * * * *